(12) United States Patent
Hosoya

(10) Patent No.: US 8,106,719 B2
(45) Date of Patent: Jan. 31, 2012

(54) VOLTAGE-CONTROLLED OSCILLATOR, PHASE-LOCKED LOOP CIRCUIT AND CLOCK DATA RECOVERY CIRCUIT

(75) Inventor: Kenichi Hosoya, Minato-ku (JP)

(73) Assignee: NEC Corporation, Tokyo (JP)

( * ) Notice: Subject to any disclaimer, the term of this patent is extended or adjusted under 35 U.S.C. 154(b) by 93 days.

(21) Appl. No.: 12/524,098

(22) PCT Filed: Jan. 22, 2008

(86) PCT No.: PCT/JP2008/050804
§ 371 (c)(1),
(2), (4) Date: Jul. 22, 2009

(87) PCT Pub. No.: WO2008/090882
PCT Pub. Date: Jul. 31, 2008

(65) Prior Publication Data
US 2010/0026404 A1     Feb. 4, 2010

(30) Foreign Application Priority Data
Jan. 23, 2007    (JP) .................................. 2007-012450

(51) Int. Cl.
*H03C 3/22* (2006.01)
*H03B 5/12* (2006.01)
(52) U.S. Cl. .............. 331/177 V; 331/36 C; 331/117 FE
(58) Field of Classification Search ................ 331/36 C, 331/117 FE, 117 R, 167, 177 V
See application file for complete search history.

(56) References Cited

U.S. PATENT DOCUMENTS

| 4,709,409 | A  | * | 11/1987 | Ma et al. ......................... 455/325 |
| 5,937,340 | A  | * | 8/1999  | Philippe et al. ................ 455/310 |
| 6,259,332 | B1 | * | 7/2001  | Hosoya ............................ 331/96 |
| 6,281,758 | B1 | * | 8/2001  | Elsayed et al. .................. 331/16 |
| 6,353,370 | B1 | * | 3/2002  | Cox et al. ................... 331/117 R |
| 6,657,509 | B1 | * | 12/2003 | Ohannes .................... 331/177 V |
| 6,774,736 | B1 | * | 8/2004  | Kwek et al. ............... 331/177 V |
| 6,842,081 | B2 | * | 1/2005  | Wang et al. ............... 331/117 R |
| 6,882,237 | B2 | * | 4/2005  | Singh et al. .................... 331/185 |
| 2005/0231296 | A1 |   | 10/2005 | Souetinov et al. |
| 2006/0220755 | A1 | * | 10/2006 | Moribe et al. ................ 331/167 |

FOREIGN PATENT DOCUMENTS

| JP | 4-8521       | A | 1/1992  |
| JP | 2004-056818  | A | 2/2004  |
| JP | 2004-260301  | A | 9/2004  |
| JP | 2005-253066  | A | 9/2005  |
| JP | 2005-333466  | A | 12/2005 |
| JP | 2006-033803  | A | 2/2006  |

* cited by examiner

*Primary Examiner* — Levi Gannon
(74) *Attorney, Agent, or Firm* — Sughrue Mion, PLLC

(57) ABSTRACT

A voltage-controlled oscillator is provided with inductor 7*a* arranged between a power supply and a ground; and a variable capacitive section 56 that configures a resonator circuit with inductor 7*a*. Variable capacitive section 56 is provided with first and second control terminals 1, 2 to which a voltage is applied to change the capacitance. Variable capacitive section 56 includes first variable capacitive element 9*a* wherein one terminal is connected to first control terminal 1 and the other terminal is connected to second control terminal 2; and second variable capacitive element 10*a* wherein one terminal is connected to second control terminal 2 and the other terminal is connected between the inductor and the ground.

6 Claims, 12 Drawing Sheets

VOLTAGE-CONTROLLED OSCILLATOR, PHASE-LOCKED LOOP CIRCUIT AND CLOCK DATA RECOVERY CIRCUIT

TECHNICAL FIELD

The present invention relates to a voltage-controlled oscillator (VCO) including a differential voltage-controlled oscillator and a single-ended voltage-controlled oscillator, which are used in microwave/milimetric-wave bands, a phase-locked loop circuit and a clock data recovery circuit.

BACKGROUND ART

An example of a voltage-controlled oscillator having two control terminals will be described.

FIG. 1 is a circuit diagram showing a differential type VCO having two control terminals. The VCO has first control terminal 1, second control terminal 2, power supply terminal 3, output terminals 4a, 4b, constant current source 5, variable capacitive section 160, inductors 7a, 7b and cross-coupled transistors 8a, 8b. Inductors 7a, 7b and variable capacitive section 160 configure a resonator circuit. Here, a circuit structure of variable capacitive section 160 is not specifically shown.

As shown in FIG. 1, power supply terminal 3 to which the potential of VDD is applied is connected with constant current source 5. The output of the source is divided into two wirings. One of the two wirings is connected with inductor 7a, output terminal 4a and cross-coupled transistor 8a between constant current source 5 and a ground, sequentially. The other wiring is connected with inductor 7b, output terminal 4b and cross-coupled transistor 8b between constant current source 5 and a ground, sequentially.

Variable capacitive section 160 is connected between node A which is between inductor 7a and output terminal 4a of the one wiring, and node A' which is between inductor 7b and output terminal 4b of the other wiring. Variable capacitive section 160 is provided with first control terminal 1 and second control terminal 2 for applying a voltage for capacitance control.

A gate terminal of cross-coupled transistor 8a is applied with potential to be outputted from output terminal 4b and a gate terminal of cross-coupled transistor 8b is applied with potential to be outputted from output terminal 4a.

Capacitance Cv(vc1, vc2) of variable capacitive section 160 depends on both a voltage (vc1) of first control terminal 1 and a voltage (vc2) of second control terminal 2. For the differential type VCO, it is deemed that Cv(vc1, vc2) indicates a capacitance of only one side of the differential. As the voltage to be applied to first control terminal 1 and second control terminal 2 changes, the capacitance of variable capacitive section 160 also changes, so that the oscillation frequency is thus controlled. The oscillation frequency of the VCO is approximately expressed by equation (1) below.

[Equation 1]

$$f(v_{c1}, v_{c2}) = \frac{1}{2\pi} \cdot \frac{1}{\sqrt{L \cdot [C_f + C_v(v_{c1}, v_{c2})]}} \quad (1)$$

wherein Cf indicates attributes of parts except variable capacitive section 160, such as cross-coupled transistors 8a, 8b and the like. For the differential type VCO, it is deemed that Cf indicates a capacitance of only one side of the differential. Although center voltages of the voltage (vc1) of first control terminal 1 and the voltage (vc2) of second control terminal 2 are not necessarily the same, it is here considered that both are the same, which is denoted as v0. At this time, a gain of the VCO (oscillation frequency sensitivity for vc1) can be expressed by equation (2) below.

[Equation 2]

$$K_{VCO}(v_{c1} = v_0) = -\frac{1}{4\pi\sqrt{L}} \cdot \frac{1}{[C_f + C_v(v_{c1} = v_0, v_{c2})]^{3/2}} \cdot \frac{\partial C_v}{\partial v_{c1}}\bigg|_{v_{c1}=v_0} \quad (2)$$

The VCO having the two control terminals as shown in FIG. 1 can be applied to a phase-locked loop (PLL) circuit or to a clock data recovery (CDR) circuit.

As examples of these, second control terminal 2 is drawn out as an external terminal of the circuit. By adjusting the voltage (vc2) to be applied to the external terminal, Cv(vc1, vc2) of equation (1) is thus changed, so that a control of a center frequency is performed. Here, the center frequency is defined as an oscillation frequency when the voltage of first control terminal 1 is the center voltage (v0). Thereby, the VCO is enabled to perform a multi-band operation, so that a multi-band operation of the PLL and a multi-bit operation of the CDR are resultantly possible. Further, it is possible to apply an architecture having the two control terminals in a loop to the PLL circuit.

In the following, a specific example of variable capacitive section 160 will be described.

FIG. 2 is a circuit diagram that specifically shows a structure of variable capacitive section 160 in the differential type VCO shown in FIG. 1. Variable capacitive section 160 in this example has first variable capacitive elements 9a, 9b and second variable capacitive elements 10a, 10b, as a variable capacitive element. First variable capacitive elements 9a, 9b and second variable capacitive elements 10a, 10b are variable capacitance diodes.

As shown in FIG. 2, anodes of first variable capacitive elements 9a, 9b are connected to each other and to first control terminal 1. Anodes of second variable capacitive elements 10a, 10b are connected to each other and to second control terminal 2. Cathodes of first variable capacitive elements 9a and second capacitive element 10a are connected to each other and to node A of the wiring between inductor 7a and output terminal 4a. Cathodes of first variable capacitive elements 9b and second capacitive element 10b are connected to each other and to node A' of the wiring between inductor 7b and output terminal 4b.

In this case, one-side capacitance Cv(vc1, vc2) of variable capacitive section 160 is expressed by equation (3) below when a capacitance value of first variable capacitive elements 9a, 9b is given as C1(vc1) and a capacitance value of second variable capacitive elements 10a, 10b is given as C2(vc2).

[Equation 3]

$$C_v(v_{c1}, v_{c2}) = C_1(v_{c1}) + C_2(v_{c2}) \quad (3)$$

Accordingly, the oscillation frequency given by equation (1) can be expressed by equation (4) below.

[Equation 4]

$$f(v_{c1}, v_{c2}) = \frac{1}{2\pi} \cdot \frac{1}{\sqrt{L \cdot [C_f + C_1(v_{c1}) + C_2(v_{c2})]}} \quad (4)$$

The VCO gain given by equation (2) can be expressed by equation (5) below.

[Equation 5]

$$K_{VCO}(v_{c1} = v_0) = -\frac{1}{4\pi\sqrt{L}} \cdot \frac{1}{\left[C_f + C_1(v_{c1} = v_0) + C_2(v_{c2})\right]^{3/2}} \cdot \left.\frac{dC_v}{dv_{c1}}\right|_{v_{c1}=v_0} \quad (5)$$

In the meantime, for a case where the same voltage is applied to the first and second control terminals, another example of the variable capacitive section is disclosed in Japanese Unexamined Patent Publication No. 2004-260301.

DISCLOSURE OF INVENTION

The gain of VCO shown in FIG. 2 is given by equation (5), as described above. When the voltage (vc2) applied to second control terminal 2 is changed to control the center frequency, only the capacitance value C2(vc2), which is in the bracket [ ] of the denominator in the second factor of the constitutional elements of the VCO gain, is changed and the other elements are not changed. Hence, as the center frequency is controlled (i.e., voltage vc2 is changed), the VCO gain is varied. In the following, this will be specifically described.

When the capacitance value C2(vc2) is increased to decrease the center frequency in accordance with equation (4), the denominator of equation (5) is increased, so that the VCO gain is reduced. On the contrary, when the capacitance value C2(vc2) is decreased to increase the center frequency in accordance with equation (4), the denominator of equation (5) is decreased, so that the VCO gain is increased. As can be seen from FIG. 3 showing a relation between the center frequency and the VCO gain, when the center frequency is increased, the VCO gain is increased. This can be also seen from FIG. 4 that schematically shows a modulation characteristic.

The VCO gain is a parameter that has a strong influence on a loop characteristic of the PLL or CDR. The variation of the VCO gain depending on the center frequency means that the characteristic of the PLL using the VCO is varied depending on the operating frequency or the characteristic of CDR is varied depending on the operation speed.

An object of the invention is to provide a voltage-controlled oscillator (VCO) such as a differential voltage-controlled oscillator, a single-ended voltage-controlled oscillator and the like, which suppresses variation of the gain when controlling a center frequency, a phase-locked loop circuit and a clock data recovery circuit.

A voltage-controlled oscillator of the invention comprises an inductor arranged between a power supply and a ground; and a variable capacitive section configuring a resonator circuit with the inductor, wherein the variable capacitive section is provided with first and second control terminals to which a voltage is applied to change a capacitance, and wherein the variable capacitive section comprises a first variable capacitive element having one terminal connected to the first control terminal and the other terminal connected to the second control terminal, and a second variable capacitive element having one terminal connected to the second control terminal and the other terminal connected between the inductor and the ground.

According to the invention, in the voltage-controlled oscillator that applies a voltage to the first and second control terminals to control a frequency, when a center frequency is set with the voltage applied to the second control terminal, a variation of a gain accompanied by control of the center frequency is suppressed.

Figure 1:
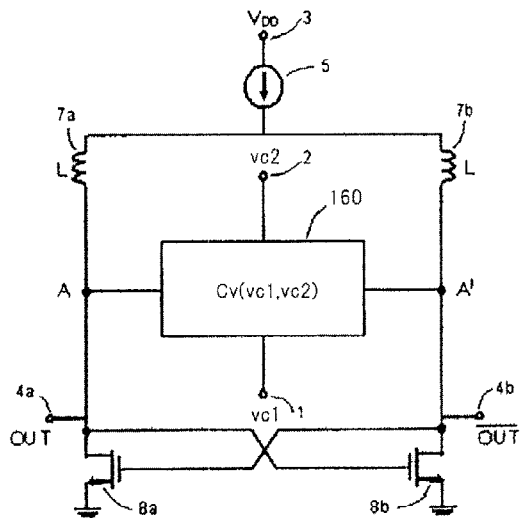
FIG. 1 is a circuit diagram showing a general differential type VCO having two control terminals.

REFERENCE NUMERALS 1 first control terminal
2 second control terminal
3 power supply terminal
4, 4a, 4b output terminals
5 constant current source
6, 56, 66, 76, 86, 96, 160 variable capacitive sections
7a, 7b inductors
8a, 8b cross-coupled transistors
9a, 9b first variable capacitive elements
10a, 10b second variable capacitive elements
11a, 11b, 18a, 18b, 19a, 19b, 21a, 21b capacitive elements
12a, 12b, 20a, 20b high frequency cutoff means
13a, 13b output transistors
14a, 14b, 17a, 17b resistance elements
15a, 15b output buffer sections
16a, 16b open stubs
22 voltage-controlled oscillator (VCO)
23 signal input terminal
24 signal output terminal
25 phase comparator
26 loop filter
27 frequency divider
28 phase/frequency detector
29a, 29b charge pumps
30 data signal input terminal
31 recovery clock signal output terminal
32 recovery data signal output terminal
33 delay circuit
34 flip flop circuit

BEST MODE FOR CARRYING OUT THE INVENTION

The embodiments of the invention will be specifically described with reference to the drawings.

First Exemplary Embodiment

Figure 5:
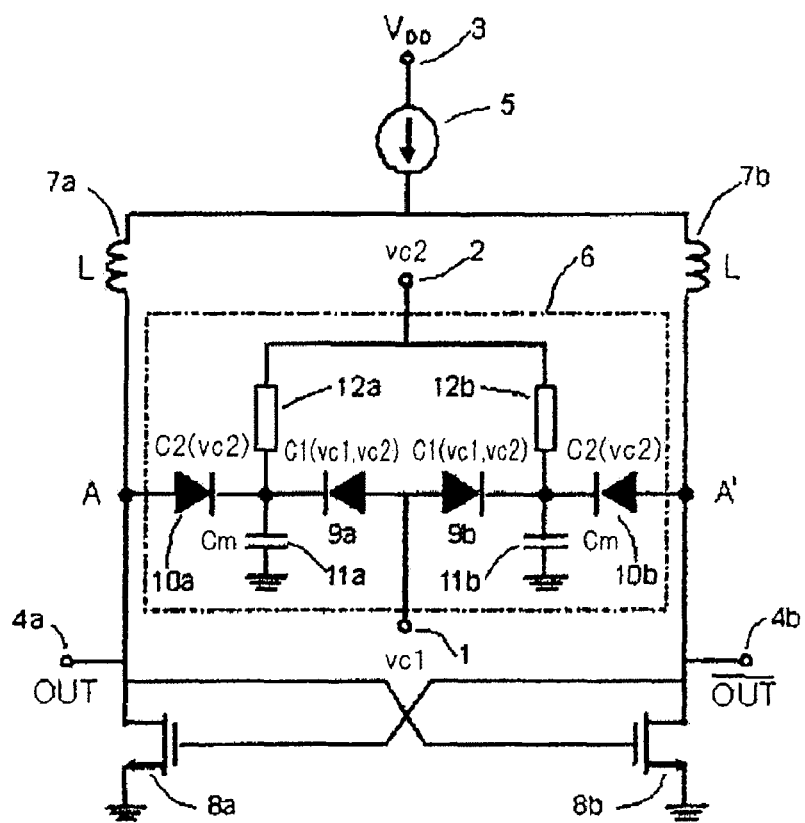
FIG. 5 shows an example of a voltage-controlled oscillator of a first exemplary embodiment.

FIG. 5 shows an example of a voltage-controlled oscillator (VCO) of this exemplary embodiment.

The VCO of this exemplary embodiment comprises first control terminal 1, second control terminal 2, power supply terminal 3, output terminals 4a, 4b, constant current source 5, variable capacitive section 6, inductors 7a, 7b and cross-coupled transistors 8a, 8b. Variable capacitive section 6 has first variable capacitive elements 9a, 9b, second variable capacitive elements 10a, 10b, capacitive elements 11a, 11b and high frequency cutoff means 12a, 12b.

As shown in FIG. 5, in variable capacitive section 6, anodes of first variable capacitive elements 9a, 9b are connected to each other and to first control terminal 1. Cathodes of first variable capacitive elements 9a and second variable capacitive element 10a are connected to each other and are grounded via capacitive element 11a. Furthermore, the connection point of the cathodes is connected to second control terminal 2 via high frequency cutoff means 12a. An anode of second variable capacitive element 10a is connected to a node A between inductor 7a and output terminal 4a.

Cathodes of first variable capacitive elements 9b and second variable capacitive element 10a are connected to each other and are grounded via capacitive element 11b. The connection point of the cathodes is connected to second control terminal 2 via high frequency cutoff means 12b. An anode of second variable capacitive element 10b is connected to a node A' between inductor 7b and output terminal 4b.

Hereinafter, an operation of the VCO of this exemplary embodiment will be described. In the meantime, since this exemplary embodiment is a differential type, the capacitance value of variable capacitive section 6 is expressed with a value of one side only.

The capacitance value Cv(vc1, vc2) of variable capacitive section 6 is given by equation (6) below when the capacitance value of first variable capacitive elements 9a, 9b is expressed with C1(vc1, vc2) and the capacitance of second variable capacitive elements 10a, 10b is expressed with C2(vc2).

[Equation 6]

$$C_v(v_{c1}, v_{c2}) = \frac{C_2(v_{c2}) \cdot [C_1(v_{c1}, v_{c2}) + C_m]}{C_2(v_{c2}) \cdot C_1(v_{c1}, v_{c2}) + C_m} \quad (6)$$

wherein Cm is the capacitance value of capacitive elements 11a, 11b. Seeing equation (6) as a function of capacitance value C2, equation (6) is a monotone increasing function of the capacitance value C2. Thus, when the capacitance value C2 is increased by changing vc2, the capacitance value Cv is also increased. A change ratio of the capacitance value of variable capacitive section 6 to vc1 can be expressed by equation (7) below.

[Equation 7]

$$\left.\frac{\partial C_v}{\partial v_{c1}}\right|_{v_{c1}=v_0} = \frac{1}{\left[1 + \frac{C_1(v_{c1}=v_0, v_{c2})}{C_2(v_{c2})} + \frac{C_m}{C_2(v_{c2})}\right]^2} \cdot \left.\frac{\partial C_1}{\partial v_{c1}}\right|_{v_{c1}=v_0} \quad (7)$$

By substituting equation (6) into equation (1), the oscillation frequency of the VCO of this exemplary embodiment is obtained. Further, by substituting equations (6) and (7) into equation (2), the VCO gain is obtained.

In the following, the capacitance-voltage characteristic (C-V characteristic) of the capacitance value C1 of first variable capacitive elements 9a, 9b and the capacitance value C2 of second variable capacitive elements 10a, 10b will be described.

Figure 6:
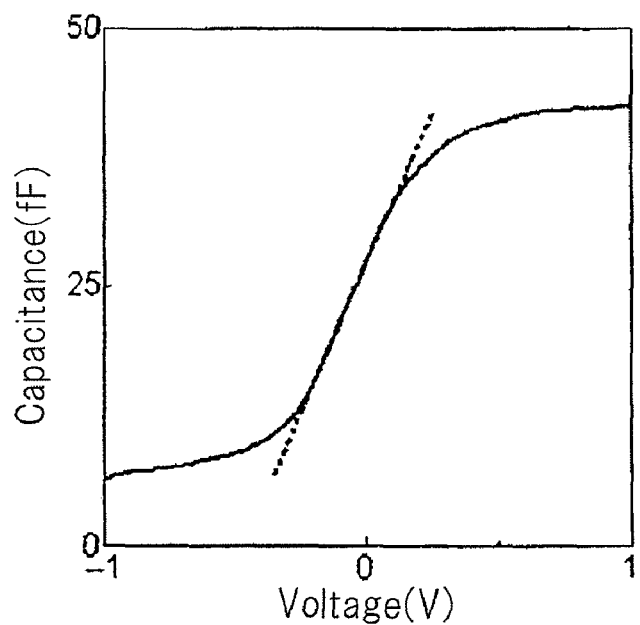
FIG. 6 is a graph showing an example of a capacitance-voltage characteristic of a variable capacitive element.

FIG. 6 shows an example of the C-V characteristic of an accumulation-mode varactor that is used as a variable capacitive element in a Complementary Metal Oxide Semiconductor (CMOS) process. As shown, the C-V characteristic exhibits a preferred linearity over a broad capacitance value range. The linear part of the C-V characteristic is mainly used in the other exemplary embodiments as well as this exemplary embodiment.

In order to simplify the case, it is assumed that the same type of variable capacitance is used for the capacitance values C1 and C2. It should be, however, noted that the sizes of capacitance values C1 and C2 are not necessarily the same. In addition, it is assumed that a direct-current voltage to be applied to the nodes A, A' is the same as the center voltage (v0) of vc1. The above assumption is made to simplify the case. In other words, the above assumption is not necessarily required for the invention.

Figure 7:
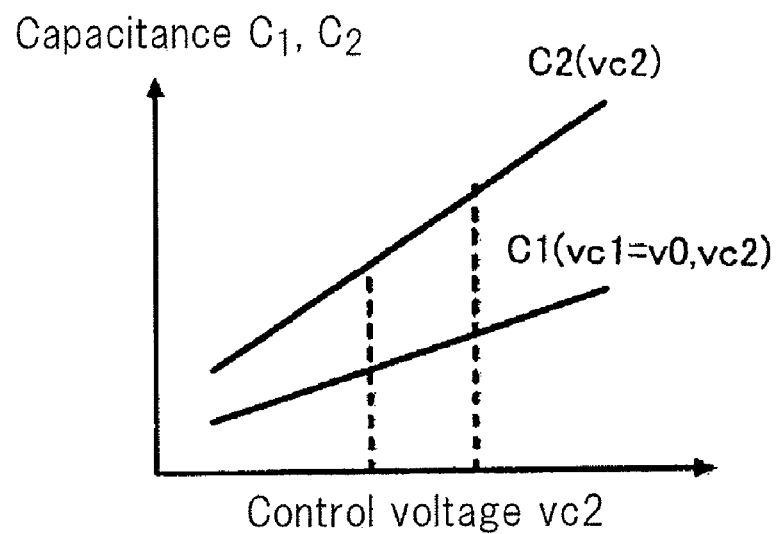
FIG. 7 is a graph schematically showing vc2 dependence of variable capacitive elements in a voltage-controlled oscillator of a first exemplary embodiment.

FIG. 7 shows that capacitance value C1 of the first variable capacitive element and capacitance value C2 of the second variable capacitive element depend on vc2 when vc1 is fixed as v0. This figure shows only the linear part of FIG. 6. As shown in FIG. 7, the ratio C1(vc1=v0, vc2)/C2(vc2), which appears in the bracket [ ] of the denominator of the first factor in equation (7), is maintained to be constant regardless of the variation of vc2.

Figure 8:
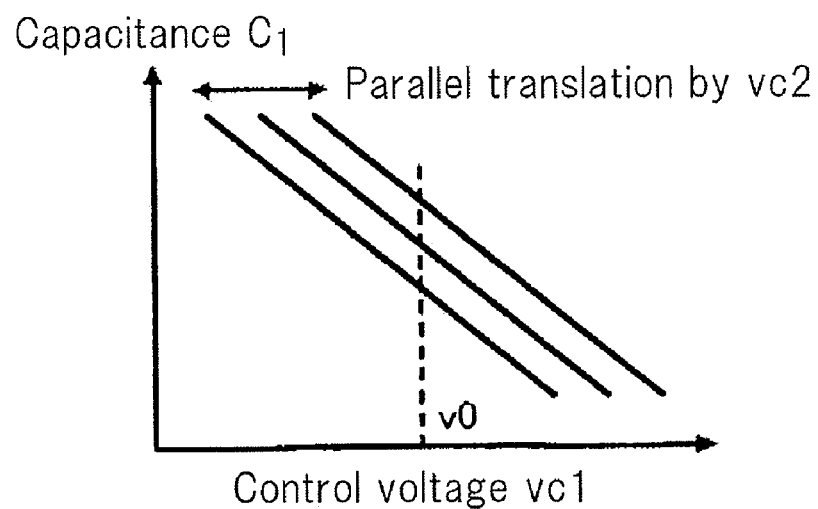
FIG. 8 is a graph showing vc1 dependence of capacitance value C1 of a first variable capacitive element in a voltage-controlled oscillator of a first exemplary embodiment, for several vc2 values.

In the meantime, FIG. 8 is a graph showing vc1 dependence of capacitance value C1 of the first variable capacitive element, for several vc2 values. Likewise, this figure shows only the linear part of FIG. 6.

As shown in FIG. 8, the curve (the straight line in this exemplary embodiment) showing vc1 dependence of the capacitance value C1 is just parallel translated in the horizontal direction when vc2 is changed. Hence, the partial differential ($\partial C1/\partial vc1$) at vc1=v0, which appears in the second factor of equation (7), is also maintained to be constant regardless of the variation of vc2.

Regarding these, since Cm does not depend on the voltage, Cm/C2(vc2) in the bracket [ ] of the denominator in equation (7) is changed depending on the vc2. When C2(vc2) is increased to reduce the center frequency in accordance with equations (1) and (6), Cm/C2(vc2) is decreased. On the contrary, when C2(vc2) is decreased to increase the center frequency in accordance with equations (1) and (6), Cm/C2(vc2) is increased.

From the vc2 dependence of the three factors (C1/C2, $\partial C1/\partial vc1$, Cm/C2) constituting the right side of equation (7), the vc2 dependence of the partial differential ($\partial Cv/\partial vc1$) at vc1=v0, which is given in equation (7), is as follows. When C2(vc2) is increased to reduce the center frequency in accordance with equations (1) and (6), the partial differential ($\partial Cv/\partial vc1$) at vc1=v0 is increased. On the contrary, when C2(vc2) is decreased to increase the center frequency in accordance with equations (1) and (6), the partial differential ($\partial Cv/\partial vc1$) at vc1=v0 is decreased.

In the following, the vc2 dependence of the VCO gain given in equations (2) and (7) will be described.

When the capacitance value C2(vc2) is increased to reduce the center frequency in accordance with equations (1) and (6), Cv in the bracket of the denominator in the second factor of equation (2) is increased and the partial differential ($\partial Cv/\partial vc1$) of the third factor is also increased. On the contrary, when C2(vc2) is decreased to increase the center frequency in accordance with equations (1) and (6), Cv in the bracket [ ] of the denominator in the second factor of equation (2) is decreased and the partial differential ($\partial Cv/\partial vc1$) of the third factor is also decreased.

Accordingly, the changes of Cv and partial differential ($\partial Cv/\partial vc1$) for vc2 tend to cancel each other, consequently suppressing a variation of the VCO gain $K_{VCO}$ for vc2. By using this property, it is possible to suppress the variation of the VCO gain accompanied by control of the center frequency.

Figure 9:
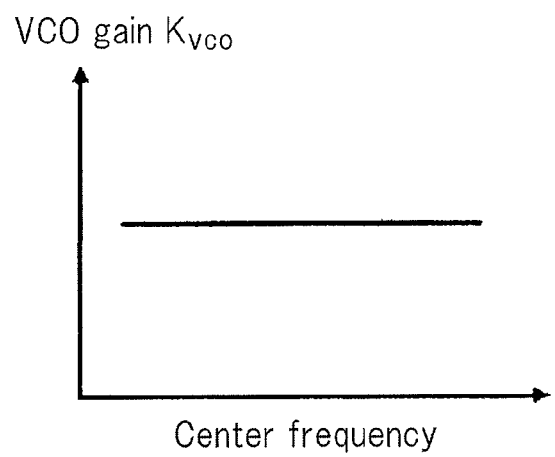
FIG. 9 is a graph showing a relation between a center frequency and a VCO gain in a voltage-controlled oscillator of a first exemplary embodiment.
Figure 10:
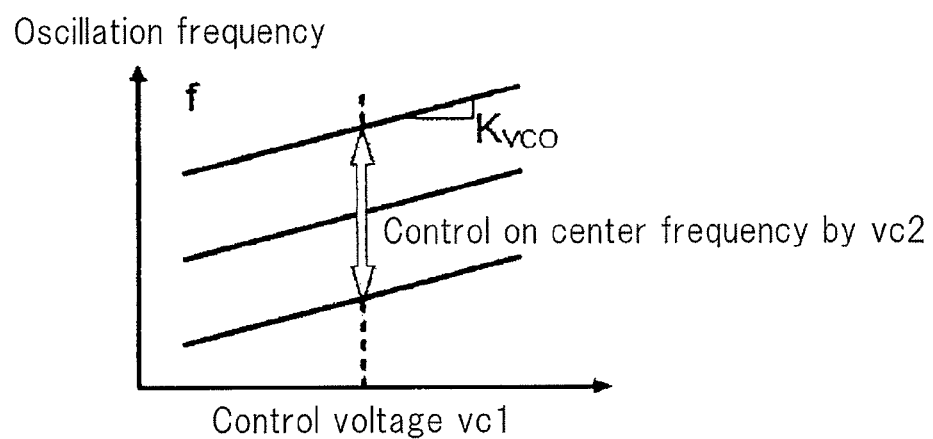
FIG. 10 is a graph schematically showing a modulation characteristic in a voltage-controlled oscillator of a first exemplary embodiment.

FIG. 9 is a graph showing a relation between a center frequency and a VCO gain obtained in the VCO of this exemplary embodiment. As shown in FIG. 9, even when the center frequency is changed, the VCO gain is little changed. FIG. 10 shows the modulation characteristic at that time. As shown in FIG. 10, even when the center frequency is changed with vc2, the slope, which shows a change of the oscillation frequency for vc1, is almost constant.

In the following, an effect of suppressing the variation of the VCO gain will be described which is confirmed by a circuit simulation.

Figure 2:
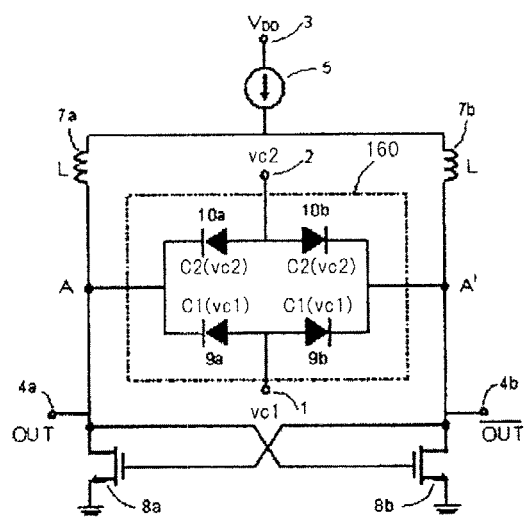
FIG. 2 is a circuit diagram showing a specific example of a variable capacitive section of the differential type VCO shown in FIG. 1.
Figure 3:
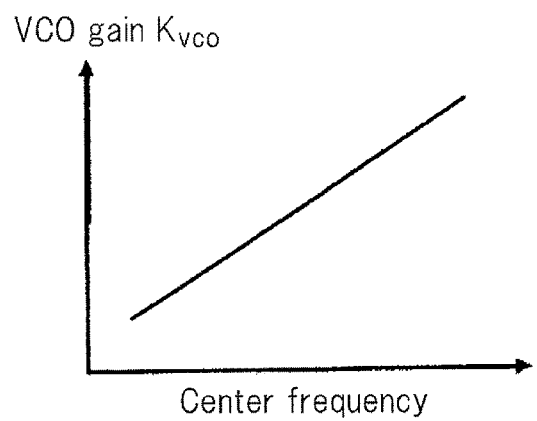
FIG. 3 is a graph showing a relation between a center frequency and a VCO gain in a related voltage-controlled oscillator.
Figure 4:
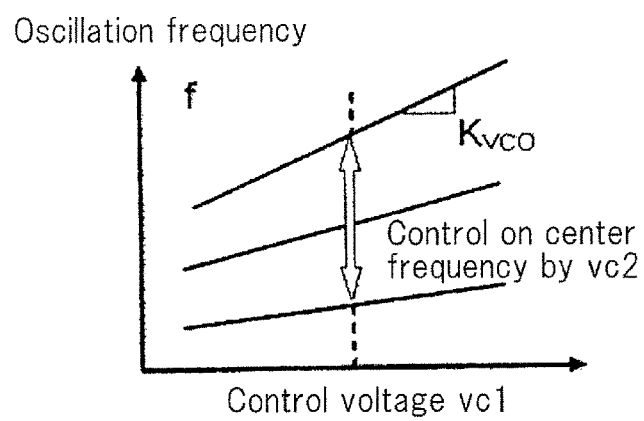
FIG. 4 is a graph schematically showing a modulation characteristic of a related voltage-controlled oscillator.
Figure 11:
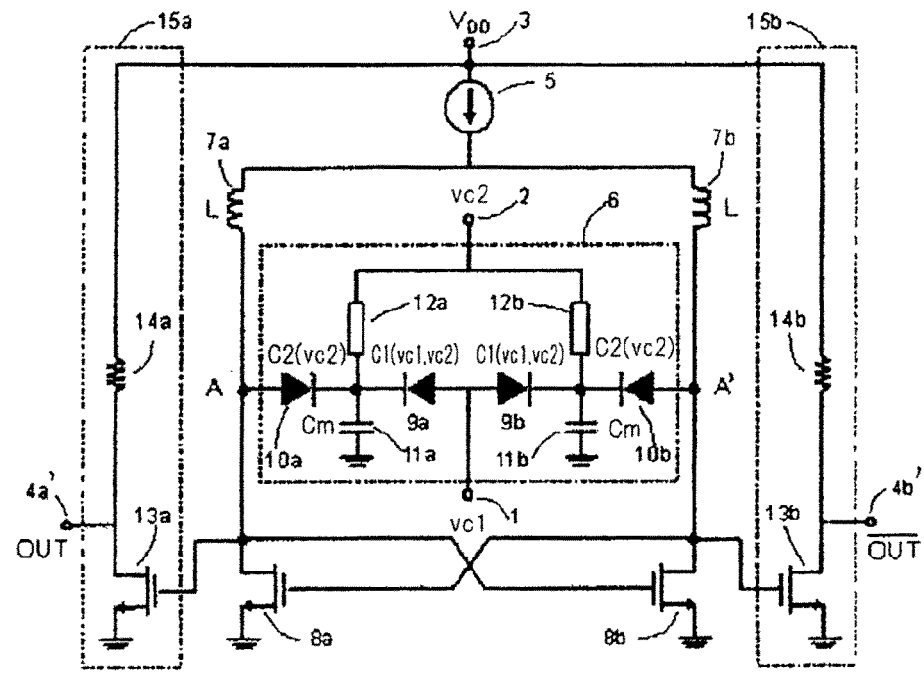
FIG. 11 shows a circuit used for simulation in a voltage-controlled oscillator of a first exemplary embodiment.
Figure 12:
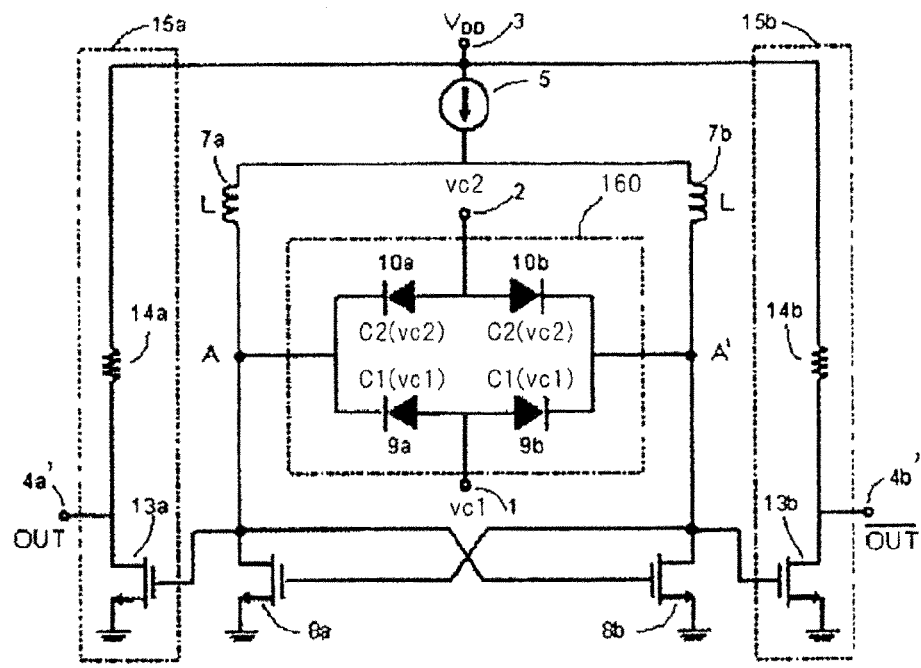
FIG. 12 shows a circuit used for simulation in the voltage-controlled oscillator shown in FIG. 2.

FIG. 11 shows a circuit used for simulation in the VCO of this exemplary embodiment. FIG. 12 shows a circuit used for simulation in the VCO shown in FIG. 2.

The circuit shown in FIG. 11 has output buffer sections 15a, 15b provided to the circuit shown in FIG. 5. The circuit shown in FIG. 12 has also output buffer sections 15a, 15b provided to the circuit shown in FIG. 2. Since output buffer sections 15a, 15b have the same structure, the structure of output buffer section 15a will be described.

Output buffer 15a has output transistor 13a and resistance element 14a. Output terminal 4a is connected to a gate terminal of output transistor 13a. One of two terminals of resistance element 14a is connected to power supply terminal 3 and the other is connected to output transistor 13a. A connection point of resistance 14a and output transistor 13a is provided with separate output terminal 4a'.

Simulation was performed by a harmonic balance method. Considering the 40 Gbps optical communication system service, the simulation was designed so as to cover the center frequency of 39.8 GHz and 43.0 GHz corresponding to Forward Error Correction (FEC).

Figure 13:
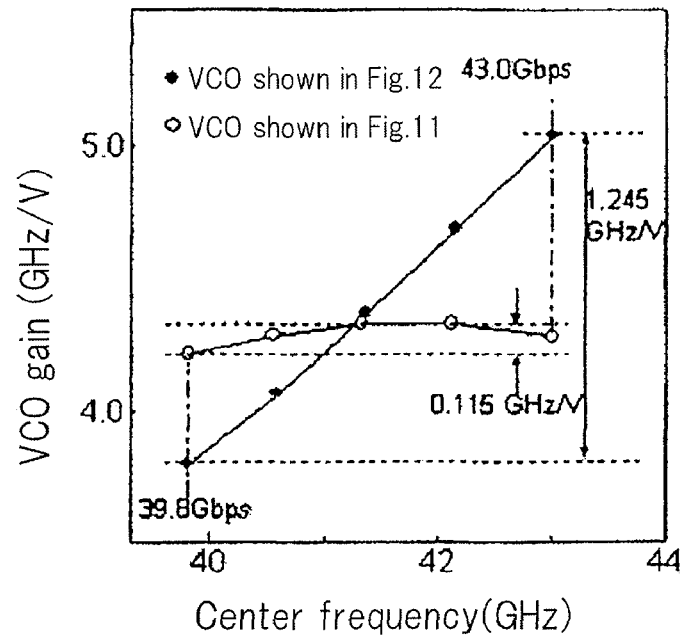
FIG. 13 is a graph showing variations of VCO gain for center frequencies with regard to the voltage-controlled oscillator of the first exemplary embodiment and the voltage-controlled oscillator shown in FIG. 12.

FIG. 13 shows variations of VCO gain for center frequencies. The result by the VCO shown in FIG. 12 is plotted with black circles and the result of the circuit by this exemplary embodiment is plotted with white circles. From the graph of FIG. 13, as compared to the VCO shown in FIG. 12, according to this exemplary embodiment, it can be seen that the variation of the VCO gain accompanied by control of the center frequency was suppressed to about ⅒.

As described above, this exemplary embodiment enables the VCO having two control terminals to suppress the variation of the VCO gain when the center frequency is controlled by one control terminal voltage.

Second Exemplary Embodiment

In a voltage-controlled oscillator of this exemplary embodiment, the capacitive elements 11a, 11b of the VCO of the first exemplary embodiment is replaced with open stubs.

Figure 14:
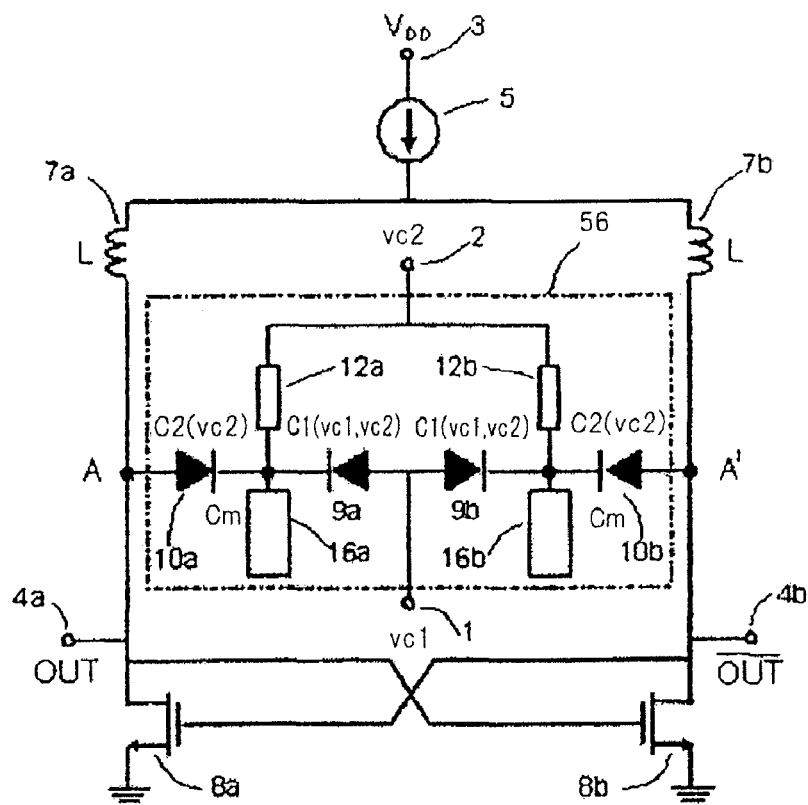
FIG. 14 shows an example of a voltage-controlled oscillator of a second exemplary embodiment.

FIG. 14 shows an example of a voltage-controlled oscillator of this exemplary embodiment. The structures which are the same as the VCO of the first exemplary embodiment shown in FIG. 5 are indicated with the same reference numerals and the description thereof will be omitted.

In variable capacitive section 56 of the voltage-controlled oscillator according to this exemplary embodiment, capacitive elements 11a, 11b of the VCO according to the first exemplary embodiment are replaced with open stubs 16a, 16b. By designing open stubs 16a, 16b to be capacitive, the stub can be equivalently considered as the capacitance. However, since the reactance thereof has a frequency dependence that is different from that of the capacitance by lumped parameter, it should be considered when designing.

Third Exemplary Embodiment

A voltage-controlled oscillator of this exemplary embodiment uses a resistance element in the high frequency cutoff means of the VCO of the second exemplary embodiment.

Figure 15:
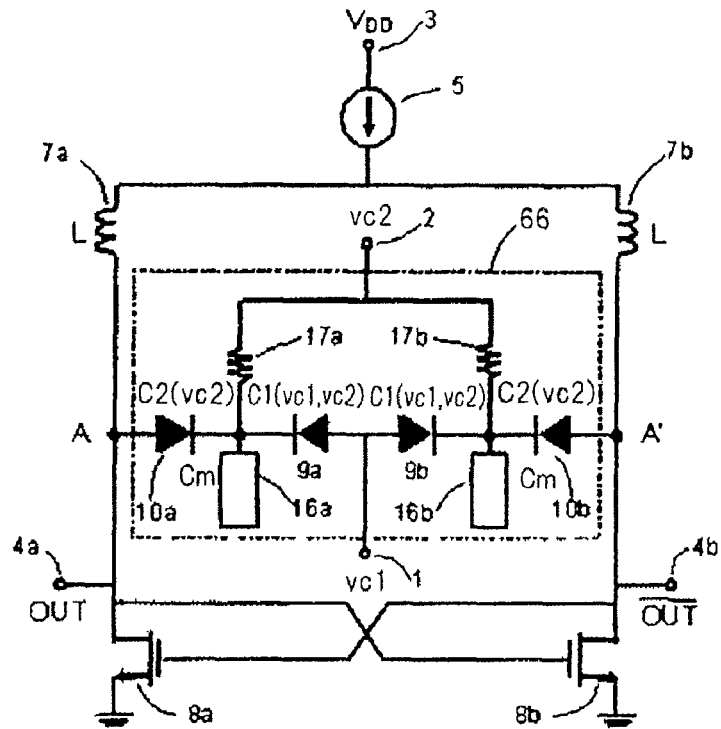
FIG. 15 shows an example of a voltage-controlled oscillator of a third exemplary embodiment.

FIG. 15 shows an example of a voltage-controlled oscillator of this exemplary embodiment. The structures which are the same as the VCO of the second exemplary embodiment shown in FIG. 14 are indicated with the same reference numerals and the description thereof will be omitted. Variable capacitive section 66 in the voltage-controlled oscillator of this exemplary embodiment uses, as the high frequency cutoff means in the VCO of the second exemplary embodiment, resistance elements 17a, 17b for high frequency cutoff means 12a, 12b, respectively.

Fourth Exemplary Embodiment

In a voltage-controlled oscillator of this exemplary embodiment, the connection manner of capacitive elements 11a, 11b shown in FIG. 5 is changed.

Figure 16:
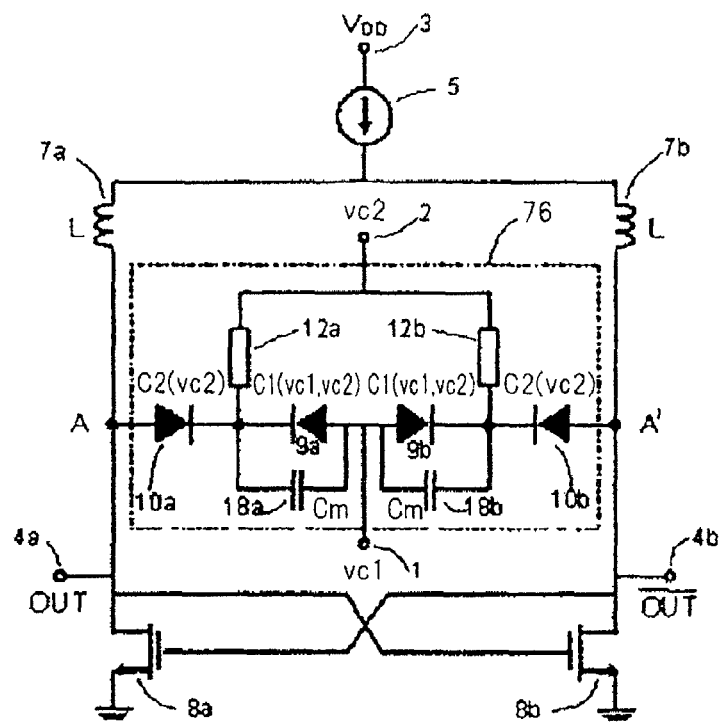
FIG. 16 shows an example of a voltage-controlled oscillator of a fourth exemplary embodiment.

FIG. 16 shows an example of a voltage-controlled oscillator of this exemplary embodiment. The structures which are the same as the VCO of the first exemplary embodiment shown in FIG. 5 are indicated with the same reference numerals and the description thereof will be omitted.

As shown in FIG. 16, in variable capacitive section 76, a connection point of the cathodes of first variable capacitive element 9a and second variable capacitive element 10a is connected to an anode of first variable capacitive element 9a via capacitor 18a. In addition, a connection point of the cathodes of first variable capacitive element 9b and second variable capacitive element 10b is connected to an anode of first variable capacitive element 9b via capacitor 18b.

In the first exemplary embodiment, one terminal of each capacitive element 11a, 11b is grounded. However, in this exemplary embodiment, the one terminal is connected to first control terminal 1. Since the operation of the VCO of this exemplary embodiment is same as that of the VCO of the first exemplary embodiment, its description will be omitted.

Fifth Exemplary Embodiment

In the following, a structure of a voltage-controlled oscillator of this exemplary embodiment will be described.

Figure 17:
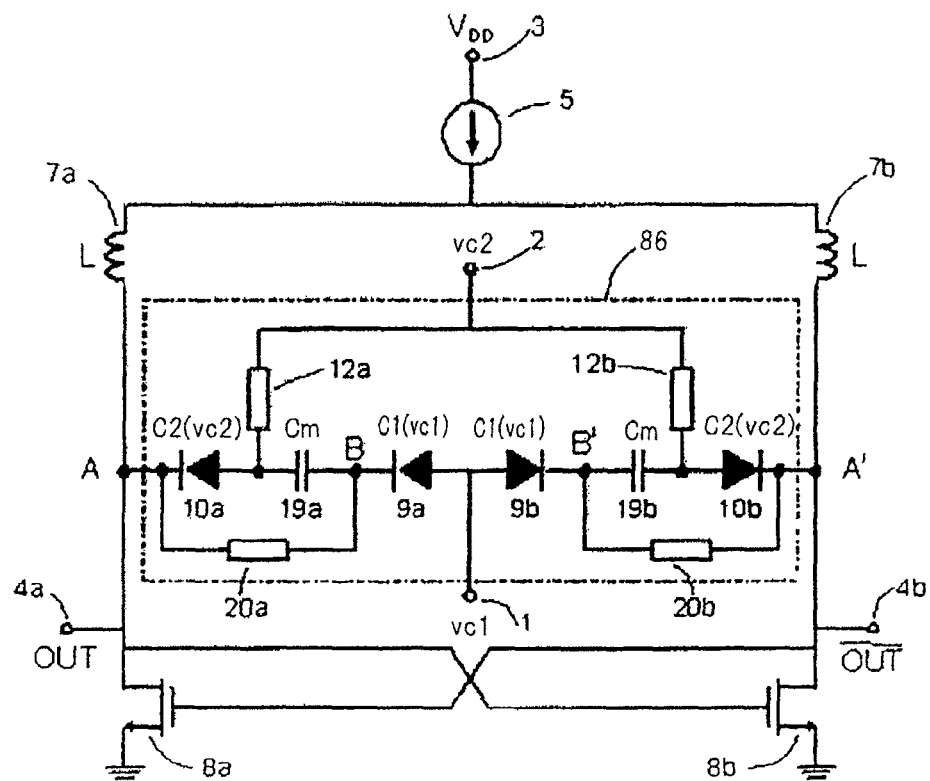
FIG. 17 shows an example of a voltage-controlled oscillator of a fifth exemplary embodiment.

FIG. 17 shows an example of a voltage-controlled oscillator of this exemplary embodiment. The structures which are the same as the VCO of the first exemplary embodiment shown in FIG. 5 are indicated with the same reference numerals and the description thereof will be omitted.

As shown in FIG. 17, in variable capacitive section 86, anodes of first variable capacitive elements 9a, 9b are connected to each other and a connection point of the anodes is connected to first control terminal 1. A cathode of first variable capacitive element 9a is connected to an anode of second variable capacitive element 10a via capacitive element 19a. A cathode of second variable capacitive element 10a is connected to node A. In addition, high frequency cutoff means 20a is connected in parallel with second variable capacitive element 10a and capacitive element 19a.

A cathode of first variable capacitive element 9b is connected to an anode of second variable capacitive element 10b via capacitive element 19b. A cathode of second variable capacitive element 10b is connected to node A'. In addition, high frequency cutoff means 20b is connected in parallel with second variable capacitive element 10b and capacitive element 19b. Thereby, a direct-current voltage is supplied to the connection point of first variable capacitive element 9a and capacitive element 19a and to the connection point of first variable capacitive element 9b and capacitive element 19b.

The connection point of the anode of second variable capacitive element 10a and capacitive element 19a is connected to second control terminal 2 via high frequency cutoff means 12a. The connection point of the anode of second variable capacitive element 10b and capacitive element 19b is connected to second control terminal 2 via high frequency cutoff means 12b.

In the following, an operation of the VCO of this exemplary embodiment will be described. In the meantime, it is permitted that the capacitance value of first variable capacitive elements 9a, 9b is expressed with C1(vc1) and the capacitance value of second variable capacitive elements 10a, 10b is expressed with C2(vc2). In addition, also in this exemplary embodiment, the capacitance value of variable capacitive section 86 is expressed with the value of one side only.

The capacitance value Cv(vc1, vc2) of variable capacitive section 86 is given with equation (8) below when the impedance of the high frequency cutoff means is high enough.

[Equation 8]

$$C_v(v_{c1}, v_{c2}) = \frac{C_1(v_{c1}) \cdot C_2(v_{c2}) \cdot C_m}{C_1(v_{c1}) \cdot C_2(v_{c2}) + C_2(v_{c2}) \cdot C_m \cdot C_1(v_{c1})} \quad (8)$$

wherein Cm is the capacitance value of capacitive elements 19a, 19b. Seeing equation (8) as a function of the capacitance value C2, equation (8) is a monotone increasing function of the capacitance value C2. Thus, when the capacitance value C2 is increased with vc2, Cv is also increased. A change ratio of the capacitance value of variable capacitive section 86 to vc1 can be expressed by equation (9) below.

[Equation 9]

$$\left.\frac{\partial C_v}{\partial v_{c1}}\right|_{v_{c1}=v_0} = \frac{1}{\left[1 + \frac{C_1(v_{c1}=v_0)}{C_2(v_{c2})} + \frac{C_1(v_{c1}=v_0)}{C_m}\right]^2} \cdot \left.\frac{dC_1}{dv_{c1}}\right|_{v_{c1}=v_0} \quad (9)$$

By substituting equation (8) into equation (1), the oscillation frequency of the VCO of this exemplary embodiment is obtained. Further, by substituting equation (9) into equation (2), the VCO gain is obtained.

Figure 18:
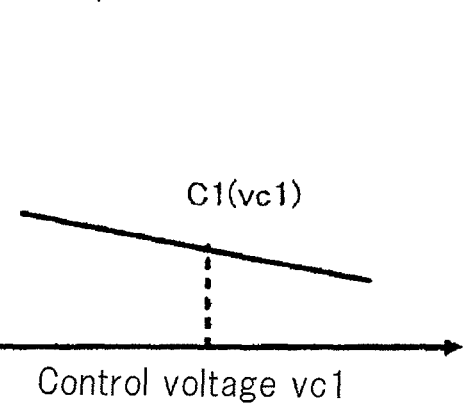
FIG. 18 is a graph schematically showing vc1 dependence of a first variable capacitive element in the voltage-controlled oscillator of the fifth exemplary embodiment.
Figure 19:
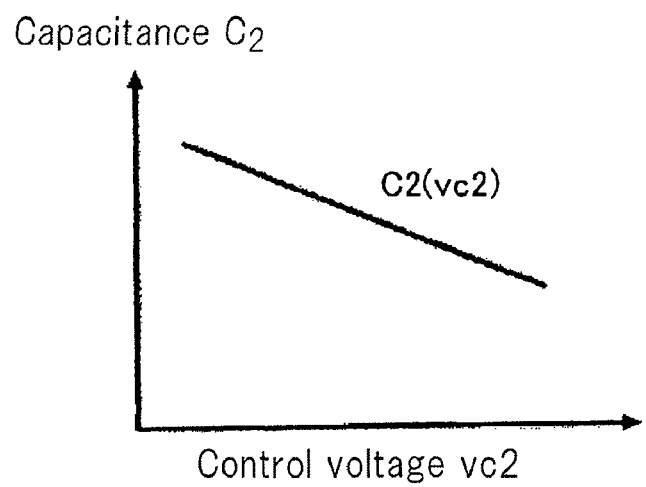
FIG. 19 is a graph schematically showing vc2 dependence of a second variable capacitive element in the voltage-controlled oscillator of the fifth exemplary embodiment.

Contrary to the first exemplary embodiment, the capacitance value C1 is a function of vc1 only and does not depend on vc2. The vc1 dependence of capacitance value C1 is schematically shown in FIG. 18, and vc2 dependence of capacitance C2 is schematically shown in FIG. 19. These figures show only the linear part of FIG. 6.

Since capacitance value C1 does not depend on vc2, C1(vc1=v0) in the bracket [ ] of the denominator of the second factor in equation (9) and dC1/dvc1 of the third factor are constant even when vc2 is changed. Since Cm does not depend on the voltage, it is also constant even when vc2 is changed. Hence, when C2(vc2) is increased to decrease the center frequency in accordance with equations (1) and (8), C1(vc1=v0)/C2(vc2) is decreased. On the contrary, when C2(vc2) is decreased to increase the center frequency in accordance with equations (1) and (8), C1(vc1=v0)/C2(vc2) is increased.

From vc2 dependence of the elements constituting the right side of equation (9), which has been already described, vc2 dependence of the partial differential (∂Cv/∂vc1) at vc1=v0, which is given in equation (9), is as follows. When C2(vc2) is increased to reduce the center frequency in accordance with equations (1) and (8), the partial differential (∂Cv/∂vc1) at vc1=v0 is increased. On the contrary, when C2(vc2) is decreased to increase the center frequency in accordance with equations (1) and (8), the partial differential (∂Cv/∂vc1) at vc1=v0 is decreased.

In the following, vc2 dependence of the VCO gain given in equations (2) and (9) will be described.

When C2(vc2) is increased to reduce the center frequency in accordance with equations (1) and (8), Cv in the bracket [ ] of the denominator of the second factor in equation (2) is increased and the partial differential (∂Cv/∂vc1) of the third factor is also increased. On the contrary, when C2(vc2) is decreased to increase the center frequency in accordance with equations (1) and (8), Cv in the bracket [ ] of the denominator of the second factor in equation (2) is decreased and the partial differential (∂Cv/∂vc1) of the third factor is also decreased. Accordingly, the changes of Cv and partial differential (∂Cv/∂vc1) for vc2 tend to cancel each other, consequently suppressing a variation of the VCO gain $K_{VCO}$ for vc2. By using this property, it is possible to suppress the variation of the VCO gain accompanied by control of the center frequency.

The factors, which determine the gain of the voltage-controlled oscillator, include a first factor that indicates a change ratio of the capacitance of the variable capacitive section to the voltage to be applied to the first control terminal, and a second factor that depends on the capacitance value of the variable capacitive section. In the first exemplary embodiment, since the first and second control terminals are connected to the first variable capacitive element, the first factor depends on the voltage to be applied to the second control terminal. By offsetting the changes of the first and second factors due to the change of the voltage to be applied to the second control terminal, the influence of the second control terminal on the gain of the voltage change is suppressed. Due to this, when the center frequency is set with the voltage to be applied to the second control terminal, the variation of the gain accompanied by control of the center frequency is suppressed.

Sixth Exemplary Embodiment

A structure of this exemplary embodiment will be described.

Figure 20:
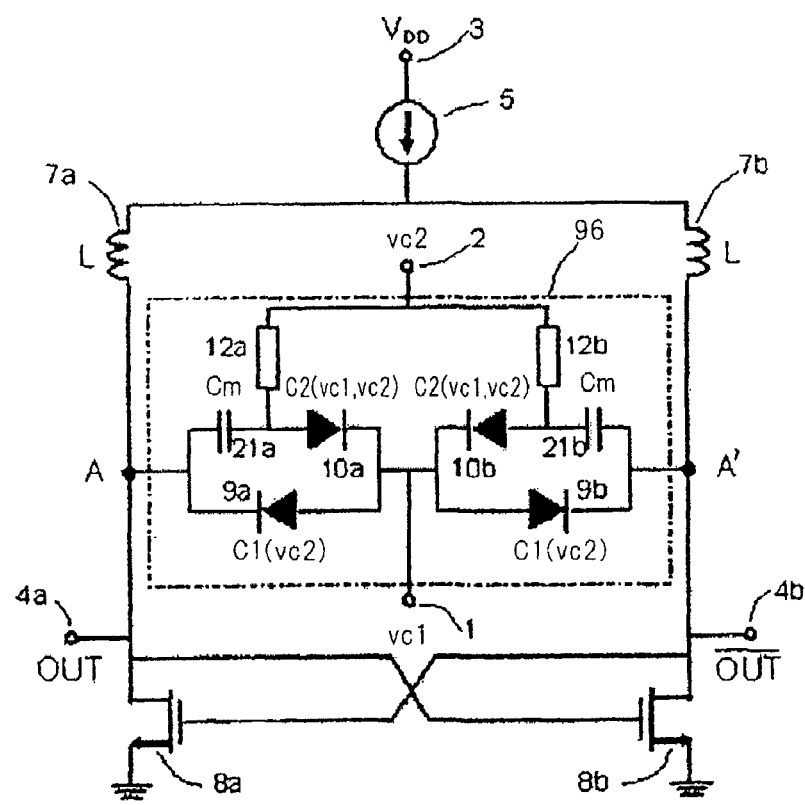
FIG. 20 shows an example of a voltage-controlled oscillator of a sixth exemplary embodiment.

FIG. 20 shows an example of a voltage-controlled oscillator of this exemplary embodiment. The structures which are the same as the VCO of the first exemplary embodiment shown in FIG. 5 are indicated with the same reference numerals and the description thereof will be omitted.

In variable capacitive section 96 shown in FIG. 20, first variable capacitive element 9a has a different polarity and is connected in parallel with second variable capacitive element 10a, and first variable capacitive element 9b has a different polarity and is connected in parallel with second variable capacitive element 10b. A connection point of an anode of first variable capacitive element 9a and a cathode of second variable capacitive element 10a is connected to first control terminal 1. A connection point of an anode of first variable capacitive element 9b and a cathode of second variable capacitive element 10b is connected to first control terminal 1.

Capacitive element 21a is connected to an anode of second variable capacitive element 10a, where the connection point is connected to second control terminal 2 via high frequency cutoff means 12a. Capacitive element 21b is connected to an anode of second variable capacitive element 10a, where the connection point is connected to second control terminal 2 via high frequency cutoff means 12b. In addition, a connection point of capacitive element 21a and the cathode of first capacitive element 9a are connected to node A and a connection point of capacitive element 21b and the cathode of first capacitive element 9b is connected to node A'. The capacitance value of first variable capacitive elements 9a, 9b is denoted as C1(vc1) and the capacitance value of second variable capacitive elements 10a, 10b is denoted as C2(vc1, vc2).

The capacitance value Cv(vc1, vc2) of variable capacitive section 96 is given by equation (10) below when the impedance of the high frequency cutoff means is high. Here, also in this exemplary embodiment, the capacitance value of variable capacitive section 96 is expressed with the value of one side only.

[Equation 10]

$$C_v(v_{c1}, v_{c2}) = C_1(v_{c1}) + \frac{C_2(v_{c1}, v_{c2}) \cdot C_m}{C_2(v_{c1}, v_{c2}) + C_m} \tag{10}$$

wherein Cm is the capacitance value of the capacitive elements 21a, 21b. Seeing equation (10) as a function of the capacitance value C2, it is a monotone increasing function of C2. Thus, when C2 is increased with vc2, Cv is also increased. A change ratio of the capacitance value of variable capacitive section 96 to vc1 can be expressed by equation (11) below.

[Equation 11]

$$\left.\frac{\partial C_v}{\partial v_{c1}}\right|_{v_{c1}=v_0} = \left.\frac{dC_v}{dv_{c1}}\right|_{v_{c1}=v_0} + \frac{C_m^2}{[C_2(v_{c1}=v_0, v_{c2}) + C_m]^2} \cdot \left.\frac{\partial C_2}{\partial v_{c1}}\right|_{v_{c1}=v_0} \tag{11}$$

By substituting equation (10) into equation (1), the oscillation frequency of the VCO of this exemplary embodiment is obtained. Further, by substituting equations (10) and (11) into equation (2), the VCO gain is obtained.

Figure 21:
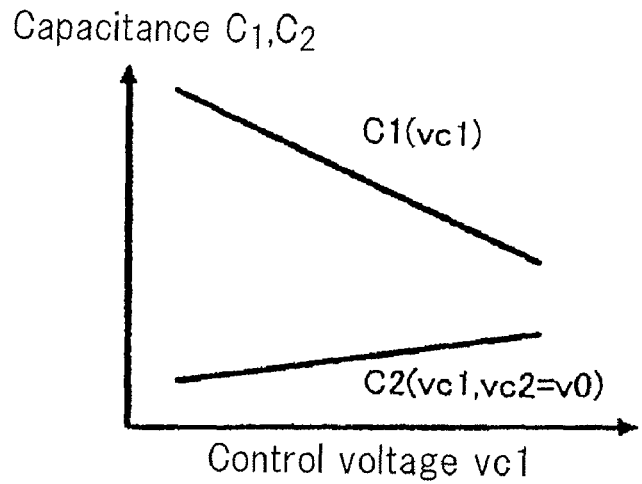
FIG. 21 is a graph schematically showing vc1 dependence of a variable capacitive element in the voltage-controlled oscillator of the sixth exemplary embodiment.

FIG. 21 schematically shows vc1 dependence of the capacitance value C1 of the first variable capacitive element, and vc1 dependence of the capacitance value C2 of the second variable capacitive element. This figure shows only the linear part of FIG. 6.

Figure 22:
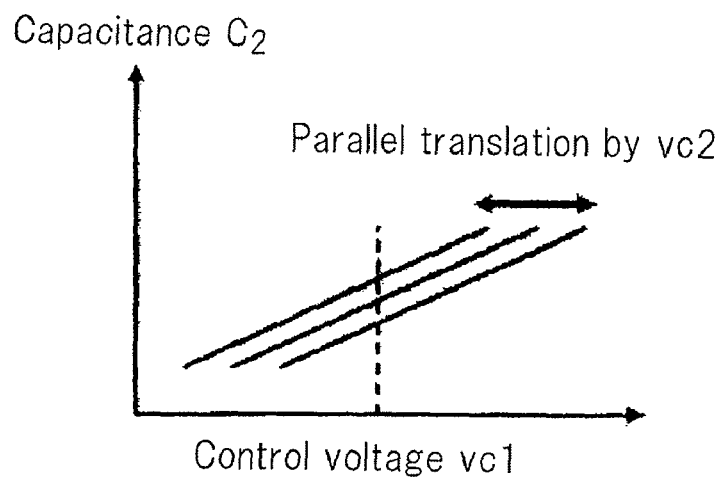
FIG. 22 is a graph showing vc1 dependence of capacitance C2 value of a second variable capacitive element in the voltage-controlled oscillator of the sixth exemplary embodiment, for several vc2 values.

As shown in FIG. 21, dC1/dvc1 and partial differential (∂C2/∂vc1) have signs that are different from each other. In the meantime, FIG. 22 schematically shows vc1 dependence of the capacitance value C2 for several vc2. Likewise, this figure shows only the linear part of FIG. 6. As shown in FIG. 22, the curve (the straight line in the figure) showing vc1 dependence of capacitance value C2 is just parallel translated in the horizontal direction when vc2 is changed. Hence, the partial differential (∂C2/∂vc1) at vc1=v0, which appears in the second factor of the second term of equation (11), is maintained to be constant regardless of the variation of vc2. Since capacitance value C1 does not depend on vc2, dC1/dvc1 is also kept to be constant regardless of the variation of vc2.

Regarding these, since the elements in the bracket [ ] of the denominator of the first factor of the second term in equation (11) are changed depending on the vc2. When C2(vc1=v0, vc2) is increased to reduce the center frequency in accordance with equations (1) and (10), the elements in the bracket [ ] are increased. On the contrary, when C2(vc1=v0, vc2) is decreased to increase the center frequency in accordance with equations (1) and (10), the elements in the bracket [ ] are decreased. Here, the parameters are selected to satisfy equation (12) below.

[Equation 12]

$$\left|\frac{dC_1}{dv_{c1}}\right|_{v_{c1}=v_0} > \frac{C_m^2}{[C_2(v_{c1}=v_0, v_{c2})+C_m]^2} \cdot \left|\frac{\partial C_2}{\partial v_{c1}}\right|_{v_{c1}=v_0} \quad (12)$$

Further, noting that dC1/dvc1 of the left side and the partial differential (∂C2/∂vc1) in the second factor of the right side have signs that are different from each other, vc2 dependence of the partial differential (∂Cv/∂vc1) at vc1=v0 given in equation (11) is as follows. When C2(vc1=v0, vc2) is increased to reduce the center frequency in accordance with equations (1) and (10), the absolute value of the partial differential (∂Cv/∂vc1) at vc1=v0 is increased. On the contrary, when C2(vc1=v0, vc2) is decreased to increase the center frequency in accordance with equations (1) and (10), the absolute value of the partial differential (∂Cv/∂vc1) at vc1=v0 is decreased.

In the following, vc2 dependence of the VCO gain given in equations (2) and (11) will be described. When C2(vc1=v0, vc2) is increased to reduce the center frequency in accordance with equations (1) and (10), Cv in the bracket [ ] of the denominator of the second factor in equation (2) is increased and the partial differential (∂Cv/∂vc1) of the third factor is also increased.

On the contrary, when C2(vc1=v0, vc2) is decreased to increase the center frequency in accordance with equations (1) and (10), Cv in the bracket [ ] of the denominator of the second factor in equation (2) is decreased and the partial differential (∂Cv/∂vc1) of the third factor is also decreased. Accordingly, the changes of Cv and partial differential (∂Cv/∂vc1) for vc2 tend to cancel each other, consequently suppressing a variation of the VCO gain $K_{VCO}$ for vc2. By using this property, it is possible to suppress the variation of the VCO gain accompanied by control of the center frequency.

The factors, which determine the gain of the voltage-controlled oscillator, include a first factor that indicates a change ratio of the capacitance of the variable capacitive section to the voltage to be applied to the first control terminal, and a second factor that depends on the capacitance value of the variable capacitive section. In the respective exemplary embodiments, since the first and second control terminals are connected to the first variable capacitive element, the first factor depends on the voltage to be applied to the second control terminal. By offsetting the changes of the first and second factors due to the change of the voltage to be applied to the second control terminal, the influence of the second control terminal on the gain of the voltage change is suppressed. Due to this, when the center frequency is set with the voltage to be applied to the second control terminal, the variation of the gain accompanied by control of the center frequency is suppressed.

In each of the first to sixth exemplary embodiments, high frequency cutoff means may be further provided between the first variable capacitive element and the first control terminal.

Seventh Exemplary Embodiment

According to this exemplary embodiment, the voltage-controlled oscillator of one of the first to sixth embodiments is applied to a phase-locked loop (PLL) circuit.

Figure 23:
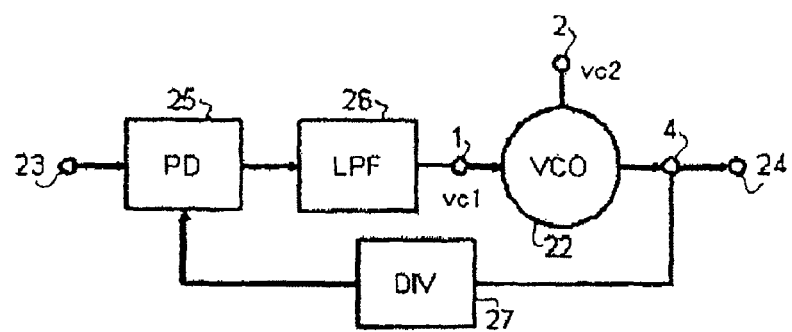
FIG. 23 is a block diagram showing an example of a phase-locked loop circuit using a voltage-controlled oscillator of the invention.

FIG. 23 is a block diagram showing an example of a phase-locked loop circuit of this exemplary embodiment. A voltage-controlled oscillator 22 of FIG. 23 indicates one of the VCOs according to the first to sixth exemplary embodiments. The output of the VCO according to the first to sixth exemplary embodiments is the differential output. However, in this exemplary embodiment, output terminals 4a, 4b are indicated with the reference numeral '4' for the purpose of simplification.

The PLL circuit of this exemplary embodiment has phase comparator (PD) 25, loop filter (LPF) 26, voltage-controlled oscillator 22 and frequency divider (DIV) 27.

Signal input terminal 23 is connected to phase comparator 25, loop filter 26 is connected to an output of phase comparator 25 and an output of loop filter 26 is connected to voltage-controlled oscillator 22. The output of loop filter 26 corresponds to first control terminal 1. Signal output terminal 24 is connected to an output of voltage-controlled oscillator 22. Frequency divider 27 is provided to a feedback line from voltage-controlled oscillator 22 to phase comparator 25.

In the PLL circuit of this exemplary embodiment, since voltage-controlled oscillator 22 controls the center frequency by second control terminal 2 and can perform an multi-band operation, the phase-locked loop circuit can operate in a plurality of frequency bands.

Eighth Exemplary Embodiment

According to this exemplary embodiment, the voltage-controlled oscillator of one of the first to sixth embodiments is applied to a phase-locked loop (PLL) circuit.

Figure 24:
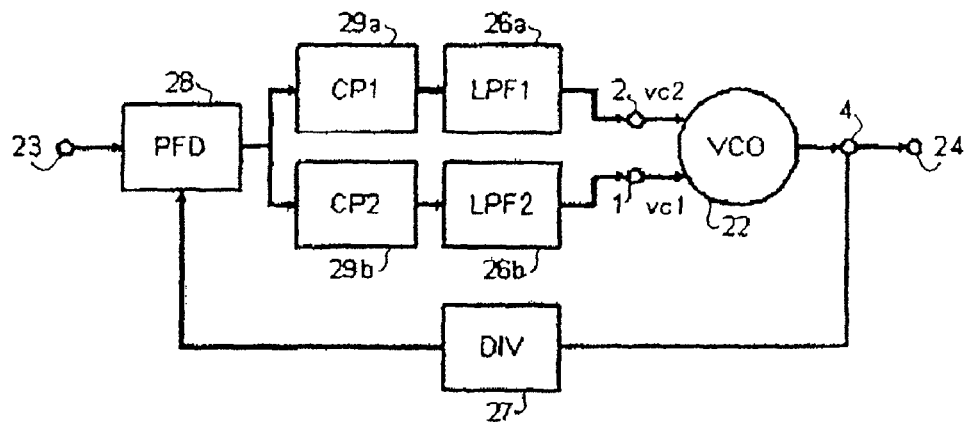
FIG. 24 is a block diagram showing another example of a phase-locked loop circuit using a voltage-controlled oscillator of the invention.

FIG. 24 is a block diagram showing an example of a phase-locked loop circuit of this exemplary embodiment. A voltage-controlled oscillator 22 of FIG. 24 indicates one of the VCOs according to the first to sixth exemplary embodiments. The output of the VCO according to the first to sixth exemplary embodiments is the differential output. However, in this exemplary embodiment, the output terminals 4a, 4b are indicated with the reference numeral '4' for the purpose of simplification.

The PLL circuit of this exemplary embodiment has phase/frequency detector (PFD) 28, charge pump (CP1) 29a, charge pump (CP2) 29b, loop filter (LPF1) 26a, loop filter (LPF2) 26b, voltage-controlled oscillator 22 and frequency divider (DIV) 27.

Signal input terminal 23 is connected to phase/frequency detector 28, charge pump 29a and loop filter 26a are sequentially connected to an output of phase/frequency detector 28 and loop filter 26a is connected to voltage-controlled oscillator 22. Signal output terminal 24 is connected to an output of voltage-controlled oscillator 22.

Between phase/frequency detector 28 and voltage-controlled oscillator 22, charge pump 29b and loop filter 26b are connected in parallel with charge pump 29a and loop filter 26a. An output of loop filter 26a corresponds to second control terminal 2 and an output of loop filter 26b corresponds to first control terminal 1. Frequency divider 27 is provided to a feedback line from voltage-controlled oscillator 22 to phase/frequency detector 28.

In this exemplary embodiment, both first control terminal 1 and second control terminal 2 are used as a control voltage of the loop.

Ninth Exemplary Embodiment

According to this exemplary embodiment, the voltage-controlled oscillator of one of the first to sixth embodiments is applied to a clock/data recovery (CDR) circuit.

Figure 25:
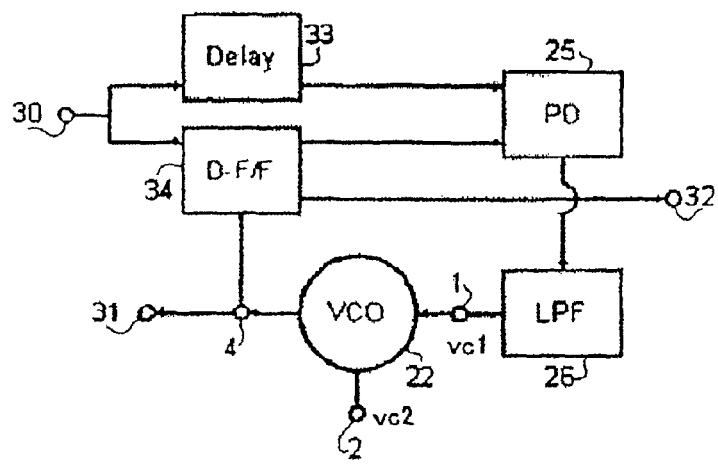
FIG. 25 is a block diagram showing an example of a clock data recovery circuit using a voltage-controlled oscillator of the invention.

FIG. 25 is a block diagram showing an example of a clock data recovery circuit of this exemplary embodiment. A voltage-controlled oscillator of FIG. 25 indicates one of the VCOs according to the first to sixth exemplary embodiments. The output of the VCO according to the first to sixth exemplary embodiments is the differential output. However, in this exemplary embodiment, output terminals 4a, 4b are indicated with the reference numeral '4' for the purpose of simplification.

The CDR circuit of this exemplary embodiment has delay circuit (Delay) 33, flip/flop circuit (D-F/F) 34, phase comparator (PD) 25, loop filter (LPF) 26 and voltage-controlled oscillator 22.

Each of two signal lines divided from data signal input terminal 30 is connected to delay circuit 33 and flip/flop circuit 34, respectively. Outputs of delay circuit 33 and flip/flop circuit 34 are connected to phase comparator 25. The other output of flip/flop circuit 34 is connected to recovery data signal output terminal 32.

Loop filter 26 is connected to an output of phase comparator 25 and voltage-controlled oscillator 22 is connected to an output of loop filter 26. The output of loop filter 26 corresponds to first control terminal 1. An output of voltage-controlled oscillator 22 is connected to flip/flop circuit 34 and recovery clock signal output terminal 31.

Since voltage-controlled oscillator 22 can perform a multi-band operation by center frequency control terminal 2, the clock data recovery circuit of this exemplary embodiment can operate in a plurality of bit rates.

Meanwhile, in the above embodiments, the differential type VCO has been described. However, the invention can be also applied to a single-ended type VCO.

Further, in the above embodiments, Metal Oxide Semiconductor Field Effect Transistor (MOSFET) has been exemplified as the active device. However, the invention is not limited to the MOSFET. For example, an active device using Metal Semiconductor Field Effect Transistor (MESFET), High Electron Mobility Transistor (HEMT), bipolar transistor and the like can also be realized with the same structure.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

This application is based upon and claims the benefit of priority from Japanese Patent Application No. 2007-012450 filed on Jan. 23, 2007, the content of which is incorporated by reference.

The invention claimed is:

1. A voltage-controlled oscillator comprising:
   an inductor arranged between a power supply and a ground; and
   a variable capacitive section configuring a resonator circuit with said inductor,
   wherein said variable capacitive section is provided with first and second control terminals to which a voltage is applied to change a capacitance,
   wherein said variable capacitive section comprises a first variable capacitive element having one terminal connected to said first control terminal and the other terminal connected to said second control terminal, and a second variable capacitive element having one terminal connected to said second control terminal and the other terminal connected between said inductor and said ground, and
   wherein in said variable capacitive section, said second control terminal is connected to a connection point of said first variable capacitive element and said second variable capacitive element, and an open stub connected to said connection point is provided.

2. The voltage-controlled oscillator according to claim 1, wherein said first variable capacitive element and said second variable capacitive element are connected by using terminals with the same polarity.

3. The voltage-controlled oscillator according to claim 1, wherein said variable capacitive section is provided with high frequency cutoff means between a connection point of said first variable capacitive element and said second variable capacitive element and said second control terminal.

4. A differential voltage-controlled oscillator having said voltage-controlled oscillator defined in claim 1.

5. A phase-locked loop circuit using said voltage-controlled oscillator defined in claim 1.

6. A clock data recovery circuit using said voltage-controlled oscillator defined in claim 1.

* * * * *

UNITED STATES PATENT AND TRADEMARK OFFICE
CERTIFICATE OF CORRECTION

PATENT NO. : 8,106,719 B2
APPLICATION NO. : 12/524098
DATED : January 31, 2012
INVENTOR(S) : Kenichi Hosoya It is certified that error appears in the above-identified patent and that said Letters Patent is hereby corrected as shown below:

In the Specification

Column 7, Line 57: Before "of the" insert -- [ ] --

Column 10, Line 30 (Approx.):

Delete "$\dfrac{C_1(v_{c1}) \cdot C_2(v_{c2}) \cdot C_m}{C_1(v_{c1}) \cdot C_2(v_{c2}) + C_2(v_{c2}) \cdot C_m \cdot C_1(v_{c1})}$" and insert -- $\dfrac{C_1(v_{c1}) \cdot C_2(v_{c2}) \cdot C_m}{C_1(v_{c1}) \cdot C_2(v_{c2}) + C_2(v_{c2}) \cdot C_m + C_m \cdot C_1(v_{c1})}$ --

Signed and Sealed this
Twenty-seventh Day of January, 2015

Michelle K. Lee
*Deputy Director of the United States Patent and Trademark Office*